US008438431B2

(12) United States Patent
McCain et al.

(10) Patent No.: US 8,438,431 B2
(45) Date of Patent: May 7, 2013

(54) SUPPORT ELEMENT OFFICE MODE ARRAY REPAIR CODE VERIFICATION

(75) Inventors: Edward C. McCain, Poughkeepsie, NY (US); Lisa Nayak, Austin, TX (US); Gerard M. Salem, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 12/615,296

(22) Filed: Nov. 10, 2009

(65) Prior Publication Data
US 2011/0113295 A1    May 12, 2011

(51) Int. Cl.
*G11C 29/00* (2006.01)
*G06F 11/00* (2006.01)

(52) U.S. Cl.
USPC .......... 714/710; 714/711; 714/718; 714/6.32; 714/29; 714/42; 714/46; 365/201

(58) Field of Classification Search .......... 714/718, 714/710, 711, 6.32, 29, 42, 46; 365/201
See application file for complete search history.

(56) References Cited

U.S. PATENT DOCUMENTS

| 5,568,408 A * | 10/1996 | Maeda ........................ 702/117 |
| 5,632,013 A | 5/1997 | Krygowski et al. |
| 5,958,068 A | 9/1999 | Arimilli et al. |
| 6,625,769 B1 * | 9/2003 | Huott et al. .................... 714/733 |
| 6,662,133 B2 | 12/2003 | Engel et al. |
| 6,845,477 B2 * | 1/2005 | Hidaka et al. ................. 714/729 |
| 6,851,071 B2 | 2/2005 | Bossen et al. |
| 6,856,569 B2 * | 2/2005 | Nelson et al. .............. 365/225.7 |
| 7,053,470 B1 * | 5/2006 | Sellers et al. ................. 257/678 |
| 7,076,699 B1 * | 7/2006 | Puri et al. ...................... 714/710 |
| 7,132,841 B1 * | 11/2006 | Bertin et al. ............. 324/750.05 |
| 7,257,745 B2 * | 8/2007 | Huott et al. ..................... 714/710 |
| 7,295,480 B2 * | 11/2007 | McPartland ................... 365/201 |
| 7,404,117 B2 * | 7/2008 | Ong et al. ...................... 714/718 |
| 7,437,626 B2 * | 10/2008 | Chang et al. ................... 714/710 |
| 7,770,067 B2 * | 8/2010 | Lockwood et al. ............. 714/30 |
| 7,779,311 B2 * | 8/2010 | Ong ............................... 714/710 |
| 7,793,173 B2 * | 9/2010 | Chang et al. ................... 714/710 |
| 7,995,418 B2 * | 8/2011 | Joshi et al. ..................... 365/227 |
| 2002/0109522 A1 * | 8/2002 | Kobayashi et al. ........... 324/765 |

OTHER PUBLICATIONS

D. Pham et al.; "Key Features of the Design Methodology Enabling a Multi-Core SoC Implementation of a First-Generation Cell Processor;" IEEE 2006; p. 871-878.
M. J. Garzaran et al.; "Tradeoffs in Buffering Speculative Memory State for Thread-Level Speculation in Multiprocessors;" ACM Transactions on Architecture and Code Optimization, vol. 2, No. 3, Sep. 2005; pp. 247-279.
B. Demsky et al.; "Automatic Detection and Repair of Errors in Data Structures;" OOPSLA; Oct. 26-30, 2003; pp. 78-95.

* cited by examiner

*Primary Examiner* — John J Tabone, Jr.
(74) *Attorney, Agent, or Firm* — Cantor Colburn LLP; William A. Kinnaman, Jr.

(57) ABSTRACT

A support element for verifying an array repair code solution includes a memory subsystem element including product data read from multichip modules utilized in a mainframe computing device, a wafer test repair algorithm, and a system test repair algorithm. The support element also includes a CPU emulator that causes the support element to perform an initial microcode load that includes a memory test, the memory test applying the wafer test repair algorithm to the product data to generate a wafer test repair solution and the system test repair algorithm to the product data to generate a system test repair solution and one or more repair rings for storing the wafer test repair solution and the system test repair solution.

2 Claims, 3 Drawing Sheets

US 8,438,431 B2

SUPPORT ELEMENT OFFICE MODE ARRAY REPAIR CODE VERIFICATION

BACKGROUND

The present invention relates to computer memory, and more specifically, verifying memory array repairs.

Testing and repairing of memory arrays prior to release to a customer is a common practice during memory array or integrated circuit fabrication. Integrated circuits (ICs) may include embedded memory arrays such as an embedded dynamic random access memory (DRAM) array, which may require testing and repair. ICs are typically formed on wafers containing multiple ICs. For testing and other purposes, each IC may include an electronic chip identification number (ecid).

These embedded memory arrays are analyzed by the fabricator using a built-in-self-test (BIST) unit that is included on the IC or using separate, stand alone testing units. The test determines the memory cells within the memory that are defective.

An advanced feature of these arrays is the incorporation of extra memory capacity that can be configured on a bit-by-bit basis to replace failed array elements. Configuring this extra memory capacity allows for hardware that can repair around damaged arrays and can continue to function without replacement or degradation. The manner in which memory is repaired shall be referred to herein as a "repair algorithm." Applying a repair algorithm rather than de-allocation may preserve portions of these caches that may have otherwise been de-allocated.

SUMMARY

According to one embodiment of the present invention, a support element for verifying an array repair code solution is disclosed. The support element of this embodiment includes a memory subsystem element including product data read from multichip modules utilized in a mainframe computing device, a wafer test repair algorithm, and a system test repair algorithm. The support element also includes a CPU emulator that causes the support element to perform an initial microcode load that includes a memory test, the memory test applying the wafer test repair algorithm to the product data to generate a wafer test repair solution and the system test repair algorithm to the product data to generate a system test repair solution. In addition, the support element of this embodiment includes one or more repair rings for storing the wafer test repair solution and the system test repair solution.

According to another embodiment, a method of verifying an array repair code solution is disclosed. The method of this embodiment includes initiating an office mode support element on a computing device; performing an initial microcode load on the office mode support element, the initial microcode load including a memory test that applies a wafer test repair algorithm to product data related to a memory on a multichip module to generate a wafer repair solution and a system test repair algorithm to the product data to generate a system test repair solution; and storing the test repair solution and the system test repair solution in one or more repair rings. Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As discussed above, IC's are typically subjected to tests (referred to herein as "wafer tests") to identify defective memory cells. For each memory unit (memory array), the testing mechanism may apply algorithms (repair algorithms) that repair the inoperable memory cells. For each memory array being 'repaired' there are a certain amount of extra rows and/or columns set aside so that if faulty memory cells are found, there are extras that can be used in their place. In operation, every time a faulty cell is accessed during normal operation, the addressing logic actually accesses one of the spares. This, for efficiency reasons, may be done on a row or column basis.

The wafer repair algorithm determines the best use of the extra rows and/or columns to replace them. The result of the wafer repair algorithm is referred to herein as the "wafer array repair solution." The wafer array repair solution is then utilized by the testing mechanism to perform a subsequent test. If the IC passes, the IC is "passed" and the wafer array repair solution is stored for later use.

The wafer array repair solution may, in one embodiment, simply refer to which bits of the memory for a particular IC are operational and which are not. That is, while a wafer repair algorithm was applied for testing purposes, only the defective bits (and possibly the extra bits used for the repairs) may form the solution. In one embodiment, the wafer array repair solution may be stored in a database for later use for each IC. The stored solution may be referred to herein as vital product data (VPD). In the case of a multichip module (MCM), the VPD for each chip forming the MCM may be stored in one or more SEEPROMs (serial EEPROMs) or other memory elements on the MCM.

In the case of large computing systems, such as servers, mainframes, and the like, the large computing system may include a dedicated workstation used for monitoring and operating a system. Such a workstation may be referred to herein as a "support element." The support element may be coupled to the central processor complex (CPC) of a mainframe or other large computing system. While the term "mainframe" is used herein, it shall be understood that the term refers to any large scale computing system including, for example, a server. One purpose of the support element is to power up the mainframe.

A support element session may be initiated from a hardware management console (HMC). In some cases, the support element may be operated in a so-called "office mode." In such a mode, the support element emulates the operation of the mainframe. It may create filler data to be used in such a simulation.

Figure 1:
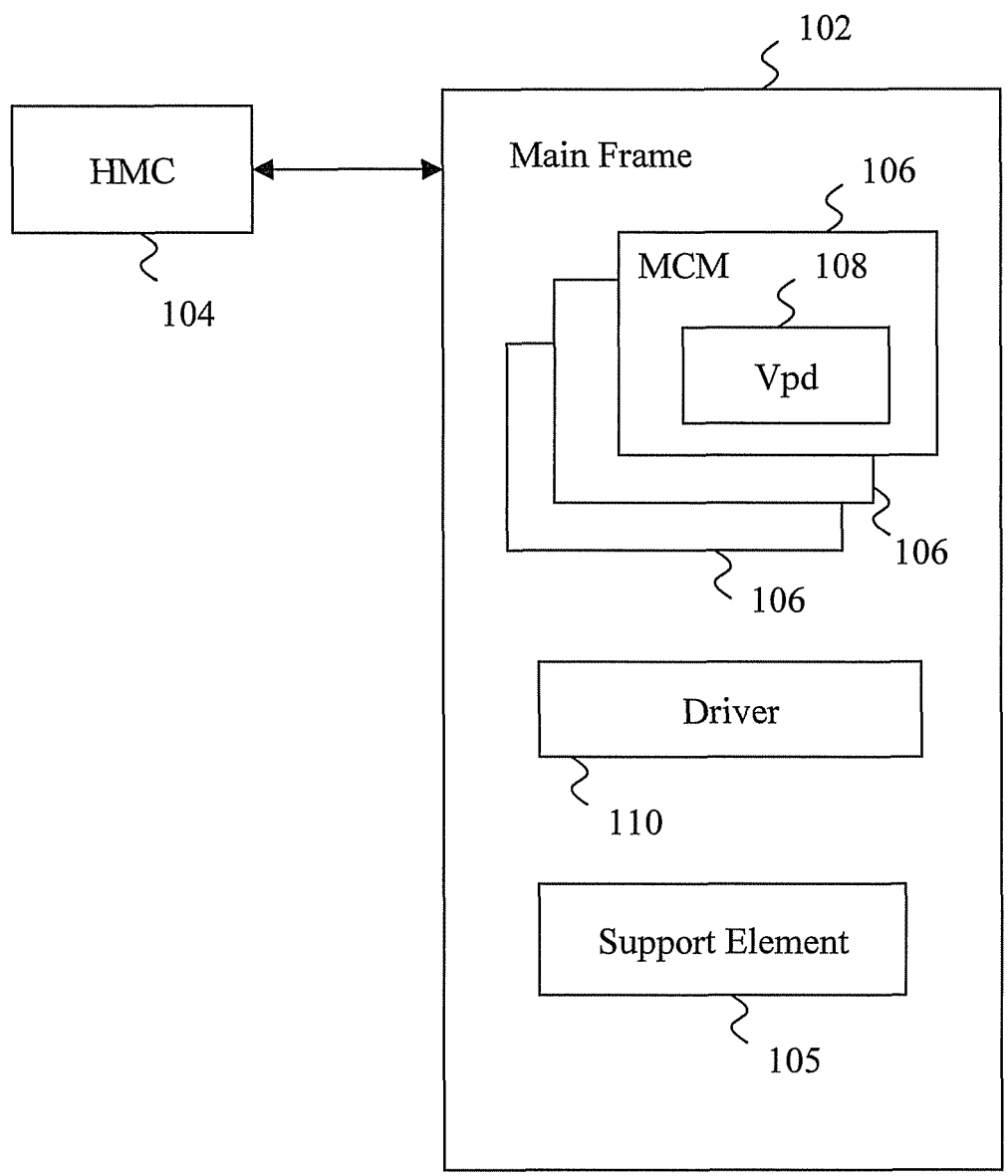
FIG. 1 is a block diagram of system on which an embodiment of the present invention may be implemented.

FIG. 1 shows an example of a system 100 according to one embodiment. The system 100 includes a mainframe computer 102 coupled to an HMC 104. Generally, an HMC may manage and monitor mainframe 102. The HMC 104 may utilize network or other connections to one or more mainframes to perform various management functions. In one embodiment, the HMC 104 may provide a standard user interface for configuring and operating a partitioned or a symmetric multiprocessor mainframe 102. The HMC 104 enables a system administrator to manage configuration and operation of partitions in a system of, as well as to monitor the system for hardware problems.

The mainframe 102 may include one or more multichip modules 106. The multichip module 106 may include a plurality of ICs (or chips) disposed thereon. In addition, one or more of the MCMs 106 may include a VPD storage element 108 disposed thereon or associated therewith. The VPD storage element 108 may include, in one embodiment, the VPD for one or more of the memory arrays on the MCM. In one embodiment, the VPD storage element 108 is a SEEPROM (serial EEPROM) that includes the VPD for that particular memory.

The mainframe 102 may also include a support element 105. In one embodiment, the support element 105 emulates operation of the mainframe 102. In such an embodiment, the support element 105 may be a self-contained unit operated outside of the system 100. For example, the support element 105 could be operated in a so-called "office mode" on a personal or other computer. The method of operation described below could be applied to a mainframe 102 as shown in FIG. 1 or by a stand alone computing device operating an office mode support element.

The mainframe 102 may also include a system driver 110. The system driver 110 may, in one embodiment, be implemented as a "kernel" or the central component of most computer operating systems. Its responsibilities include managing the system's resources (the communication between hardware and software components). Usually as a basic component of an operating system, a kernel can provide the lowest-level abstraction layer for the resources (especially memory, processors and I/O devices) that the application software controls to perform its function. It typically makes these facilities available to application processes through inter-process communication mechanisms and system calls. Of course, the system driver 110 could also be implemented as the operating system itself.

In operation, during power on or start up of the microcomputer 102, the support element 105 will load a particular driver, e.g. driver 110. An initial microcode load (IML) is then performed. An IML is a process used in servers, such as IBM zSeries servers (mainframes), to initialize the hardware, load the firmware, and enable the server for customer use. In addition, an IML may include causing various memory testing functions to be performed. In one embodiment, the IML may cause a routine to read the SEEPROMS to obtain the wafer array repair solution. From this solution, one or more repair algorithms will make repairs and the results are stored in a so-called repair ring. The repair ring is then scanned to the MCM 106 and defines how the extra memory will be used to circumvent the damaged cells.

The process just described may work satisfactorily in many cases. However, assume that the repair algorithm used at power on is different from that used at wafer test. In such a case, the two solutions may be different. Different solutions may lead to uncertainty in the validity of a prior test of the chip. That is, if a different repair algorithm is applied, the solution may be different. A different solution may result in a different result of, for a example, a BIST run at power on. In short, a chip repaired in one manner may be deemed "acceptable" while the same chip repaired in another manner may not be acceptable.

To overcome such a problem, one embodiment of the present invention may be directed to a method of determining that the wafer and system test repair algorithms are the same. In one embodiment, 100 multichip module SEEPROMs are selected from the manufacturing database (including some that have caused errors in the code algorithm that have been already found). They are applied to the support element 105 and Initial Microcode Load is executed. The IML causes a system test solution to be stored in a repair ring. The results of the wafer repair solution may be compared to the system test solution. This may help guarantee the quality of the support element code algorithm is applying the same solution as already found at wafer test.

Figure 2:
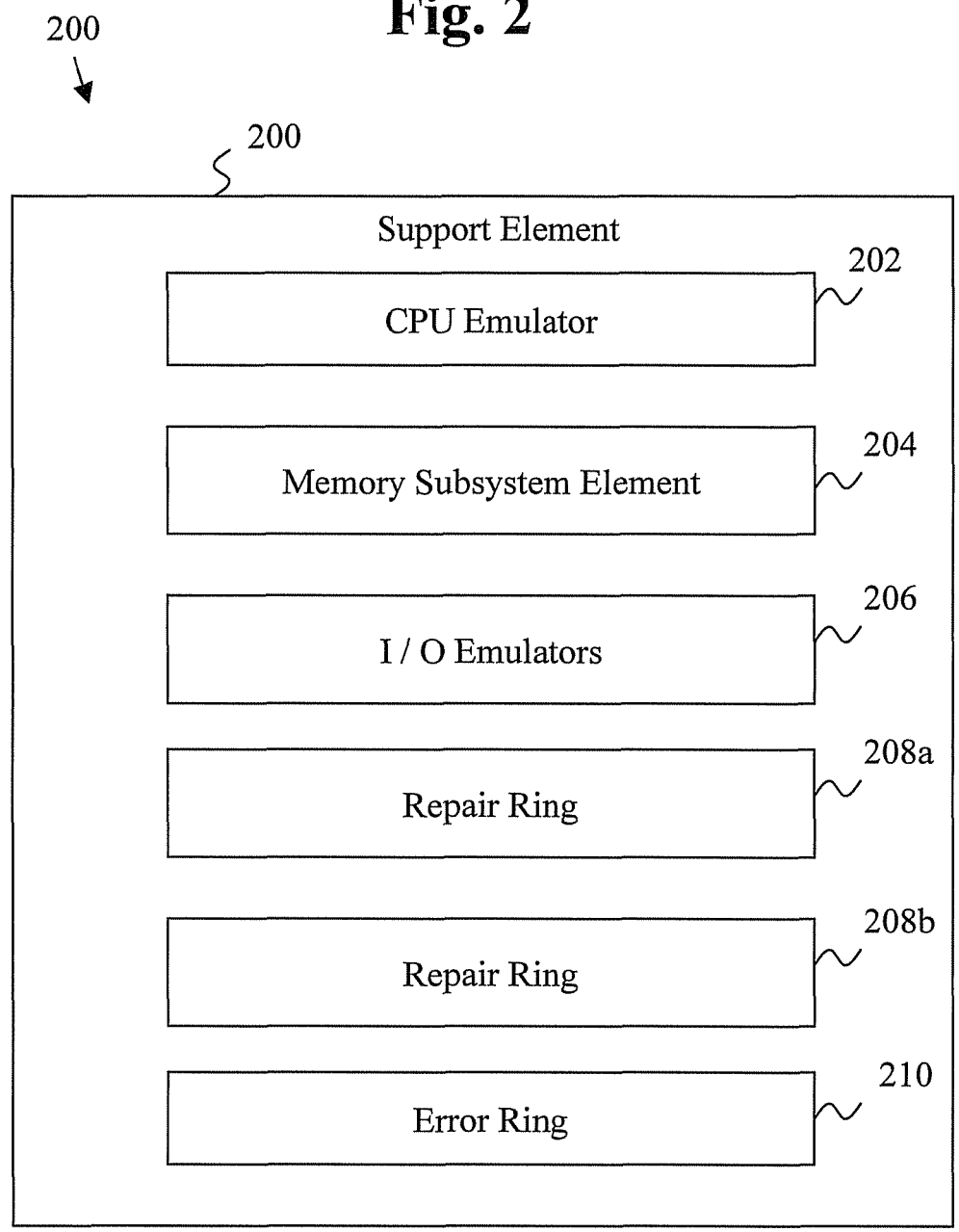
FIG. 2 is a block diagram of an office mode support element according to one embodiment.

FIG. 2 shows a block diagram of an office mode support element 200, according to one embodiment. The office mode support element 200 may be implemented in the support element 105 (FIG. 1) or on a separate computing device such as, for example, a personal computer. In general, the office mode support element 200 is an emulation of the support element 105 (FIG. 1). An emulator (or office mode), as used herein, shall refer to a computing system either within or outside of the mainframe that duplicates (provides an emulation of) the functions of the mainframe. In particular, emulation is performed such that the office mode support element 200 behaves like (and appears to be) the mainframe.

Most emulators just emulate a hardware architecture—if operating system firmware or software is required for the desired software, it must be provided as well (and may itself be emulated). Both the OS and the software may then be interpreted by the emulator, rather than being run by native hardware. Apart from this interpreter for the emulated binary machine's language, some other hardware (such as input or output devices) may be provided in virtual form as well; for example, if writing to a specific memory location should influence what is displayed on the screen, then this would need to be emulated. Typically, an emulator is divided into modules that correspond roughly to the emulated mainframe's subsystems. Accordingly, in one embodiment, the office mode support element 200 may include a CPU emulator/simulator 202; a memory subsystem module 204; and various I/O devices emulators 206.

The memory subsystem element 204 may include emulations of the memory for some or all of the MCMs in the system being emulated. In this case, the memory subsystem element 204 may include the wafer test repair solution. As discussed above, the CPU emulator 202 may cause and IML to be performed. In one embodiment, the initial microcode load may also cause a system test to be performed. The system tests may include creating an array solution for memory units stored in the memory subsystem 204. The repair solution may be created by one or more repair algorithms. These algorithms may be the same as or different from those applied at the wafer test. In one embodiment, the algorithm to be applied is read from the memory subsystem 204 and results (solution) of the algorithm may be stored in the repair ring 208a.

In operation, the CPU emulator 202 causes various drivers (or versions thereof) to be run. The operation of these drivers and any exceptions generated may be stored in, for example, an error ring 210. Analyzing the exceptions between drivers may be useful in determining errors in the different drivers or other components caused by utilization of different drivers.

Figure 3:
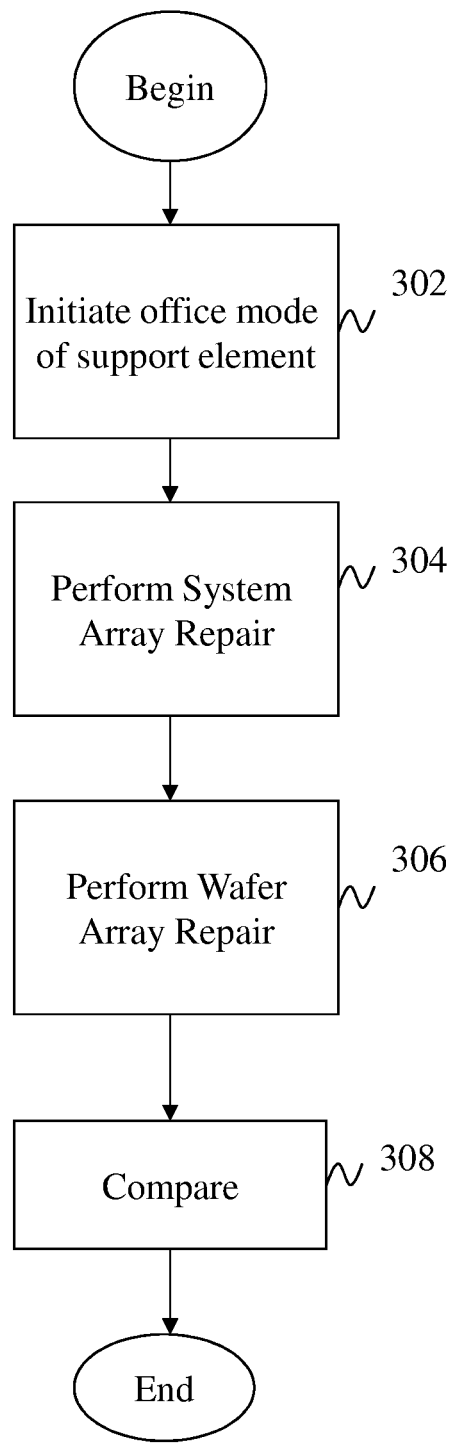
FIG. 3 shows a flow chart of method according to embodiment.

FIG. 3 shows a flow chart showing a method of confirming that the repair algorithm applied at wafer test is the same applied at a system test. At a block 302 an office mode support element is initiated. The office mode support element may be initiated, in one embodiment, on a computing device physically separate from the mainframe. In one embodiment, this may include storing some or all of the defects found in the wafer test into the memory subsystem unit. In addition, the array algorithm applied at wafer test may also be stored.

At a block 304 a system array repair is performed. This repair may include applying a system array repair algorithm to the defective cells. The results of the repair (the system test repair solution) may be stored in a first repair ring. For example, the results of the repair may be stored in first repair ring 208a.

At a block 306 a wafer array repair simulation is performed. This repair simulation may include applying the wafer array repair algorithm to the defective cells. The results of the repair (the wafer test repair solution) may be stored in a second repair ring. For example, the results of the repair may be stored in second repair ring 208b (FIG. 2).

At a block 308 the first and second repair rings are compared to one another. If they are the same, then the repair algorithms are the same. Otherwise, an exception may be generated.

The system array repair of block 304 may include several substeps. For example, block 304 may include some or all of the following steps in the case where the office mode support element is emulating a IBM zSeries Mainframe. These steps assume a previously running office mode support element.

For each MCM, the MCM serial number may be determined. In addition, it may be determined if a particular MCM is an overflow case or not. Then, the Iqyylog.log file, a cache line repair (clr) file and a functional array repair (far) file are removed. Then, the VPD_S1 file is copied to /console/seeprom/module1.bin and VPD_S2 is copied to console/seeprom/module2.bin. This step sets up the office mode environment to have the repair initialization data from the chip manufacturing process. Next, the currently running driver is killed and a new version is started. This may include performing checks to make sure the new driver started properly and got to HSMEnd. The previously fenced hardware is then reset using, for example, degtool r. The repair rings may then be flushed and an IML performed. During the IML, as described above, the repair rings have the repair solution written thereto The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of verifying an array repair code solution, the method comprising:
    initiating an office mode support element on a computing device;
    performing an initial microcode load on the office mode support element, the initial microcode load including a memory test that applies a wafer test repair algorithm to product data related to a memory on a multichip module to generate a wafer repair solution and a system test repair algorithm to the product data to generate a system test repair solution, wherein the initial microcode load is performed each time the computing device is powered on or started up;
    storing the wafer test repair solution in a first repair ring and the system test repair solution in a second repair ring; and
    comparing the first repair ring to the second compare ring to determine if the wafer test repair algorithm matches the system test repair algorithm and, thereby verify the array repair code solution.

2. The method of claim 1, wherein the support element is initiated on a mainframe computing device.

* * * * *